United States Patent [19]
Liaw et al.

[11] Patent Number: 5,960,276
[45] Date of Patent: Sep. 28, 1999

[54] USING AN EXTRA BORON IMPLANT TO IMPROVE THE NMOS REVERSE NARROW WIDTH EFFECT IN SHALLOW TRENCH ISOLATION PROCESS

[75] Inventors: Jhon-Jhy Liaw; Dun-Nian Yaung, both of Taipei; Jin-Yuan Lee, Hsin-Chu, all of Taiwan

[73] Assignee: Taiwan Semiconductor Manufacturing Company, Ltd., Hsin-Chu, Taiwan

[21] Appl. No.: 09/161,406

[22] Filed: Sep. 28, 1998

[51] Int. Cl.[6] ..................................... H01L 21/76
[52] U.S. Cl. .................. 438/224; 438/223; 438/433; 438/525; 438/524
[58] Field of Search ..................... 438/525, 524, 438/199, 221, 223, 224, 296, 433

[56] References Cited

U.S. PATENT DOCUMENTS

| | | | |
|---|---|---|---|
| 5,013,673 | 5/1991 | Fuse | 437/38 |
| 5,047,359 | 9/1991 | Nagatomo | 437/35 |
| 5,401,998 | 3/1995 | Chui et al. | 257/368 |
| 5,851,900 | 12/1998 | Chu et al. | 438/224 |

OTHER PUBLICATIONS

Swolf, "Silicon Processing for the RLSI Era" vol. 3 Lattice Press, Sunset Beach, CA 1995, pp. 222–226.

*Primary Examiner*—Trung Dang
*Attorney, Agent, or Firm*—George O. Saile; Stephen B. Ackerman; William J. Stoffel

[57] ABSTRACT

A method to form, in a NMOS area, a shallow trench isolation (STI) having B doped sidewalls regions 44 to reduce the NMOS reverse narrow width effect in narrow active areas 12N (e.g., narrow channel regions <0.1 μm wide). A substrate is provided having a NMOS area 13 and a PMOS area 15. A pad oxide layer 20 and a barrier layer 22 are formed on the substrate. Trenches 24 are etched in the substrate 10 in the NMOS and PMOS areas. The etching forms narrow active areas 12N and wide active areas 12W. The narrow active areas 12N have a width between 0.4 and 1.0 μm. A liner layer 30 is grown on the sidewalls and bottom of the trench on the substrate. A first photoresist layer is formed covering the PMOS areas and having first opening over the NMOS areas. In a critical step, a large angle Boron implantation is performed into the sidewalls and the bottom of the trenches forming Boron doped regions 44 in the substrate. The first photoresist layer is removed. An insulating layer 50 is formed in the trenches in the NMOS and PMOS areas. PMOS field effect transistors in the PMOS areas and NMOS field effect transistors in the NMOS areas are formed. The invention's boron doped regions 44 reduce the reverse narrow wide effect in the NMOS areas.

10 Claims, 3 Drawing Sheets

USING AN EXTRA BORON IMPLANT TO IMPROVE THE NMOS REVERSE NARROW WIDTH EFFECT IN SHALLOW TRENCH ISOLATION PROCESS

BACKGROUND OF INVENTION

1. Field of the Invention

This invention relates generally to fabrication of isolation regions for semiconductor devices and more particularly to a method of forming shallow trench isolation (STI) regions having boron regions on the trench sidewalls in NMOS areas.

2. Description of the Prior Art

As the design rules is continue to shrink for high density circuit, the inventors understand that the NMOS devices will face the problem of the reverse narrow width effect in shallow trench isolation process. The reverse narrow width effect problem increases the sub -threshold leakage.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,047,359 (Nagatomo), U.S. Pat. No. 5,013,673 (Fuse), and U.S. Pat. No. 5,401,998 (Chiu). Wolf, "Silicon Processing for the VLSI ERA Volume 3", Lattice Press 1995, pp. 222 to 226, describes narrow gate width effects on Threshold voltage.

SUMMARY OF THE INVENTION

It is an object of the present invention to provide a method of forming shallow trench isolation (STI) regions having boron doped regions 44 only on the trench sidewalls 24 only in NMOS device areas, not in PMOS areas.

It is an object of the present invention to provide a method of forming shallow trench isolation (STI) regions having boron regions on the trench sidewalls in NMOS areas that controls the reverse narrow width effect.

It is an object of the present invention to provide a method of forming shallow trench isolation (STI) regions having boron doped regions 44 only on the trench sidewalls 24 in NMOS device areas, by using a photoresist layer 11 has openings only in NMOS device areas 13.

The invention is a method to form, only in NMOS areas 13, a shallow trench isolation (STI) having B doped sidewalls 44 to reduce and control the NMOS reverse narrow width effect in narrow active areas 12N (e.g., narrow channel regions). A key point of the invention is that the STI trench sidewall doped regions 44 are only formed in NMOS device areas 13. A second key point of the invention is that the NMOS reverse narrow width effect is found by the inventors to occur on active areas 12N with widths less than 1.0 $\mu$m. More particularly the concentrations and set points defined in the invention control the NMOS reverse narrow width effect problem.

The invention includes the following steps. A substrate is provided having a NMOS area 13 and a PMOS area 15. The NMOS area 13 is where NMOS devices will be built and the PMOS area is where PMOS devices will be built. A pad oxide layer 20 and a barrier layer 22 are formed on the substrate. Trenches 24 are etched in the substrate 10 in the NMOS and PMOS areas. The trenches define active region areas 12N 12W and isolation areas 14. The trenches 24 have sidewalls and a bottom. The etching forms narrow active areas 12N and wide active areas 12W. The narrow active areas 12N have a width between 0.4 and 1.0 $\mu$m. The inventors have found that the narrow active areas 12N (narrow channel regions (<1.0 $\mu$m) suffer from the NMOS reverse narrow width effect. The wide active areas 12W have a width greater than 1.0 $\mu$m. A liner layer 30 is grown on the sidewalls and bottom of the trench on the substrate 24. A first photoresist layer is formed covering the PMOS areas and having first opening over the NMOS areas. In a critical step, a large angle Boron implantation is performed into the sidewalls and the bottom of the trenches forming Boron doped regions 44 in the substrate. The first photoresist layer is removed. An insulating layer 50 is formed in the trenches in the NMOS and PMOS areas. Next we form PMOS field effect transistors in the PMOS areas and form NMOS field effect transistors in the NMOS areas. The boron doped regions 44 reduce the reverse narrow wide effect in the NMOS areas.

An important feature of the invention is that the Boron doped sidewall trench regions 44 are only formed in the NMOS areas and not in the PMOS areas.

The invention also can be implemented by implanting P ions into isolation trenches PMOS device regions using a photoresist layer to cover non-PMOS regions during the P implant.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 3A is viewed along the axis 3A/3A' shown in FIG. 3B.

DETAILED DESCRIPTION OF THE PREFERRED EMBODIMENTS

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

Figure 1:
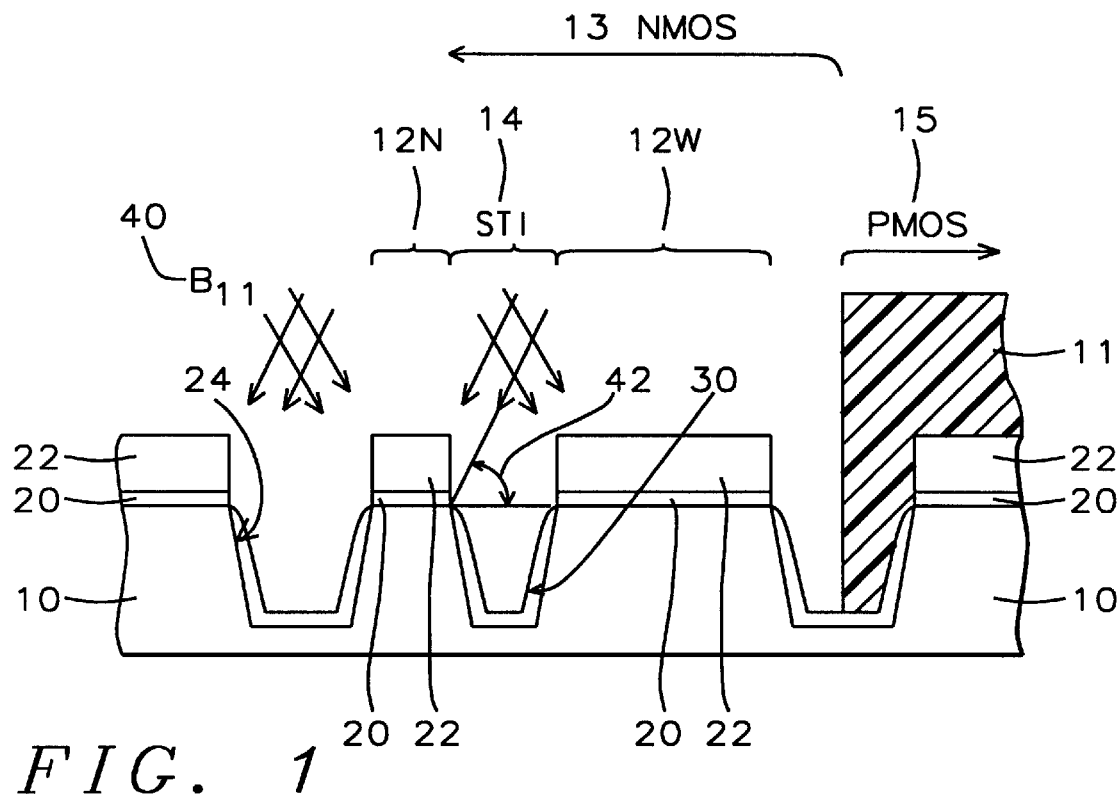
FIGS. 1 and 2 are cross sectional views for illustrating a method for boron doped sidewall regions 44 in NMOS areas according to the present invention.
Figure 2:
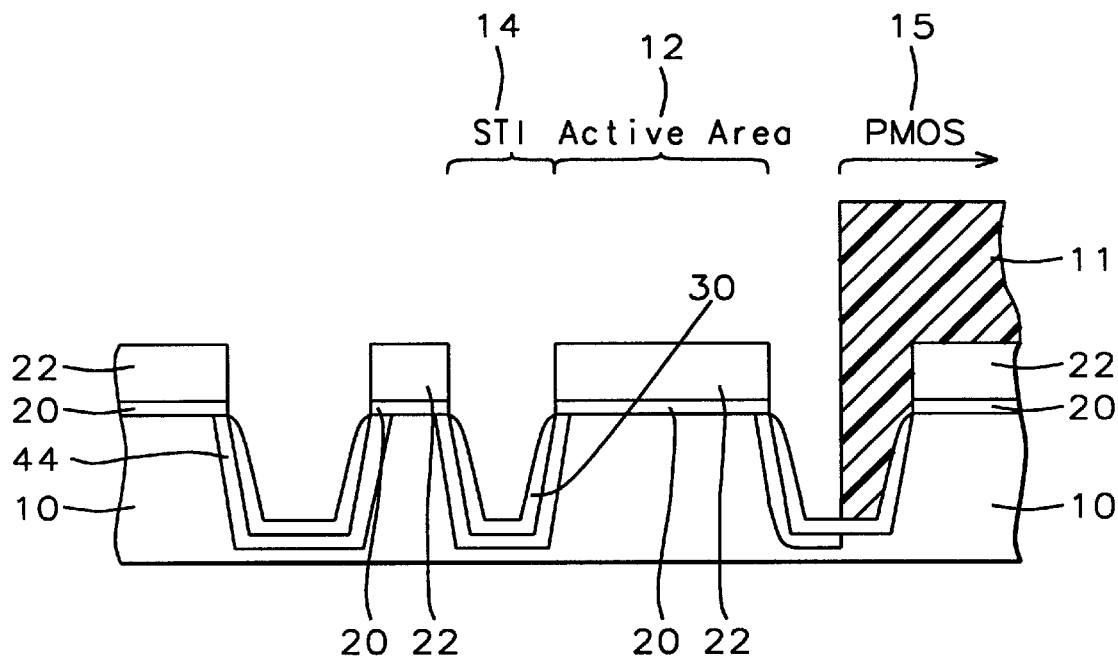
Figure 3A:
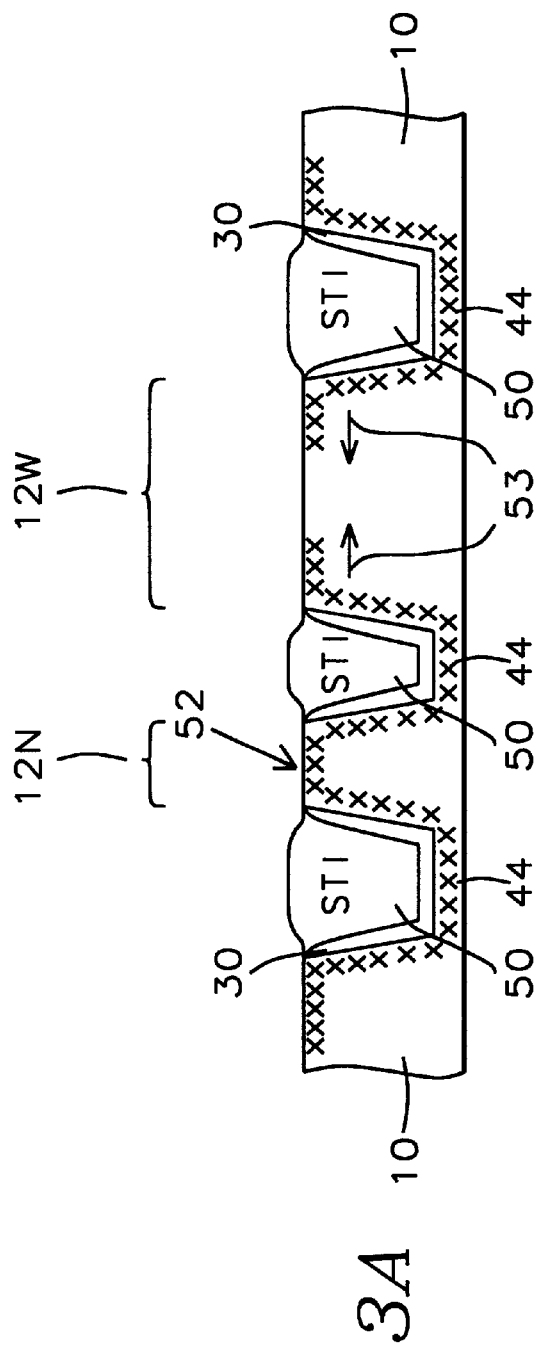
FIG. 3A shows a cross sectional views illustrating the invention's method for boron doped sidewall regions 44 in doped regions in narrow active areas 12N in NMOS areas.

The invention's method of fabricating shallow trench isolation (STI) only in NMOS areas by using a large angle Boron ion implant (I/I) to reduce the NMOS reverse narrow width effect; is shown in FIGS. 1, 2 and 3A.

A substrate is provided having a NMOS area and a PMOS area 15. The NMOS area is where NMOS Devices will be built and the PMOS area 15 is where PMOS devices will be built. FIG. 1 shows a key photoresist layer 11 covering the PMOS area 15. The photoresist layer 11 covers all non-NMOS device areas.

Still referring to FIG. 1, a pad oxide layer 20 and a barrier layer (silicon nitride ($Si_3N_4$) layer 22 are sequentially deposited over the substrate surface.

The pad oxide layer preferably has a thickness in a range of between about 50 and 250 Å and barrier layer preferably composed of silicon nitride preferably has a thickness in a range of between about 1000 and 2500 Å.

Next, we etch trenches 24 in the substrate 10 in the NMOS and PMOS areas. The trenches define active region areas 12N 12W and isolation areas 14. The trenches 24 have sidewalls and a bottom.

The trenches 24 preferably have a depth in a range of between about 2500 and 7000 Å and a width 24W in a range of between about 0.2 µm and 10000 µm.

The active areas have width in a range of between about 0.15 µm and 200 µm. The invention specifically addresses the problem of the NMOS reverse Width effect that the invention has found to occur on channel widths 12N (Active area) less than 1.0 µm wide. See FIG. 1. The problem is not found on channel widths (active area) greater than 1.0 µm. In FIG. 1, channel width 12W is greater than 1 µm.

Next, a liner layer ( thermal oxide) layer 30 is grown on the substrate in the trenches 24. The thermal oxide layer preferably having a thickness in a range of between about 100 and 400 Å.

Subsequently, a first photoresist layer 11 is formed covering the PMOS areas 15 and has first openings over the NMOS areas.

In a key step, a large angle Boron implantation is performed into the sidewalls and the bottom of the trenches forming Boron doped regions 44 in the substrate. The large angle Boron ($B_{11}$) implantation performed at an energy between about 15 and 45 Kev, a dose between about 3E12 and 5E13 ions/cm², and at an angle (42) to the substrate surface between about 15 and 45 degrees.

FIG. 2 shows the resultant boron doped areas 44. The Boron doped regions 44 preferably have a width in a range of between about 200 Å and 1000 Å and a boron concentration in a range of between about 1E18 and 1E20 atoms/cm³.

The doped region 44 preferably has the about the same dopant concentration on the sidewalls and the bottom. (See FIG. 2).

The first photoresist layer is removed.

Referring to FIG. 3A, an insulating layer 50 is deposited in the trenches 24 in the NMOS and PMOS areas. FIG. 3A shows the doped regions 44 after a heat cycle (e.g., oxidation, drive in, etc.). FIG. 3A shows the B diffusion 53 of the doped regions 44 along the trenches up to the surface of the Active areas. This causes the narrow width effect in the area 52 as the transistors are formed over the narrow Active areas (narrow channel width 12N) share more B charge. The invention's boron doped regions 44 in only the NMOS areas control the reverse narrow wide effect in the NMOS areas.

Next, we form PMOS field effect transistors in the PMOS areas and form NMOS field effect transistors in the NMOS areas.

Figure 3B:
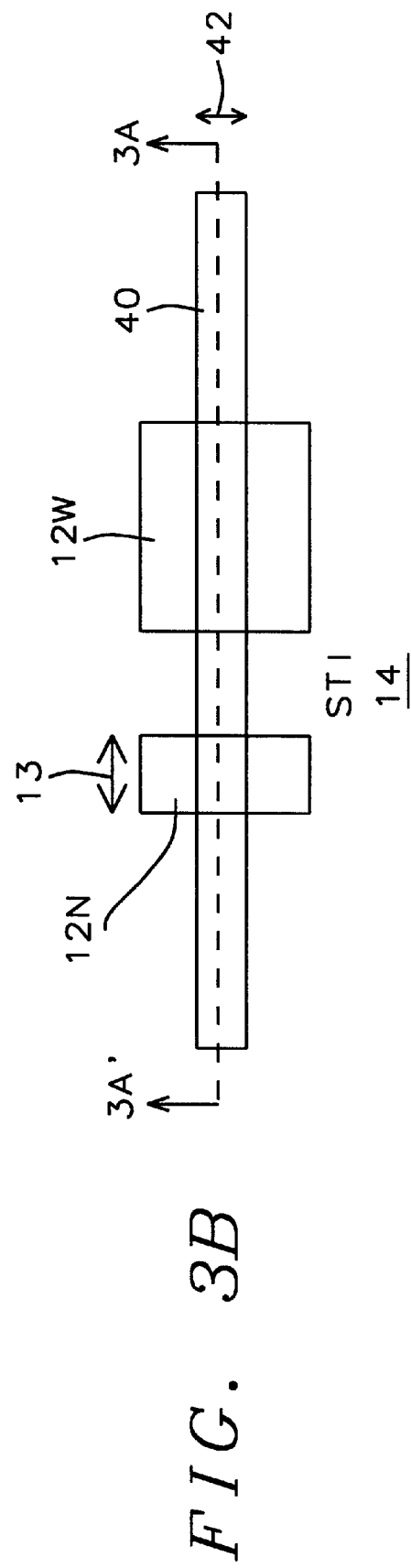
FIG. 3B shows a top plan view of a device formed using the invention's angled B ion implant (I/I) into the STI trench sidewalls.

FIG. 3B shows a top down view of the substrate after the gate 40 is formed over the shallow trench isolation (STI) and active areas . Referring to FIG. 3B, conductive gates 40 are formed over the active areas and STI areas. The conductive gates 40 have a channel width 42.

Figure 4:
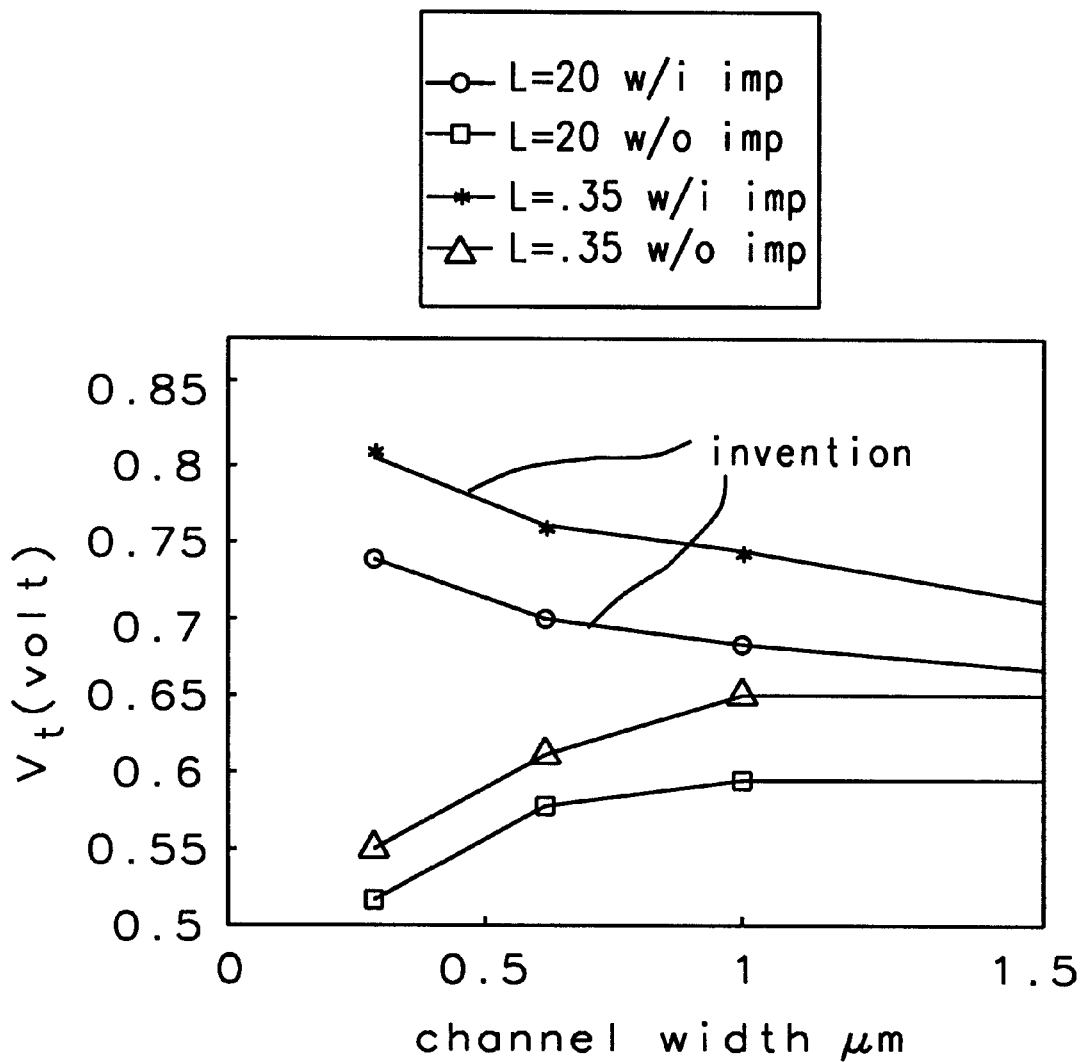
FIG. 4 is a graph showing the Vt vs Channel width for the invention's B implanted regions 44 and standard no B region.

FIG. 4 and the table below shows the benefit of invention's B doped trench sidewall regions 44. The invention's B doped trench sidewall regions 44 significantly increase the Vt especially at small channel widths.

TABLE

Threshold Voltages for the Invention's B- doped regions 44 compared with non-implanted STI (Threshold voltages in (Vt))

| CHANNEL LENGTHS | CHANNEL WIDTH (µM) | | | |
|---|---|---|---|---|
| | 20 | 1 | 0.6 | 0.3 |
| L = 20 Invention's B I/I region 44 | 0.643 | 0.68 | 0.703 | 0.74 |
| L = 20 No I/I | 0.641 | 0.596 | 0.577 | 0.518 |
| L = 0.35 Invention's B I/I region 44 | 0.646 | 0.732 | 0.758 | 0.81 |
| L = 0.35 No I/I | 0.685 | 0.649 | 0.61 | 0.555 |

Where L = channel lengths in (µm)
The spacing of the trench isolation (e.g., 12W, FIG. 1) is by 0.25 µm and 100 µm.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication shallow trench isolation in a NMOS area using a large angle Boron ion implant to reduce the NMOS reverse narrow width effect; comprising the steps of :

a) providing a substrate have a NMOS area and a PMOS area; said NMOS area is where NMOS devices will be built and said PMOS area is where PMOS devices will be built;

b) depositing a pad oxide layer and a barrier layer;

c) etching trenches in said substrate in said NMOS and PMOS areas; said trenches define active region areas and isolation areas; said trenches having sidewalls and a bottom; the etching forms narrow active areas and wide active areas ; said narrow active areas have a width between 0.4 and 1.0 µm; said wide active areas have a width greater than 1.0 µm;

d) growing a liner layer on said sidewalls and bottom of said trench on said substrate;

e) forming a first photoresist layer covering said PMOS areas and having a first opening over said NMOS areas;

f) performing a large angle Boron implantation into said sidewalls and said bottom of said trenches forming Boron doped regions in said substrate;

g) removing said first photoresist layer;

h) depositing an insulating layer in said trenches in said NMOS and PMOS areas and forming PMOS field effect transistors in said PMOS areas and forming NMOS field effect transistors in said NMOS areas whereby said boron doped regions reduce the reverse narrow wide effect in the NMOS areas.

2. The method of claim 1 wherein said pad oxide layer has a thickness in a range of between about 50 and 250 Å, and barrier layer is composed of silicon nitride having a thickness in a range of between about 1000 and 2500 Å.

3. The method of claim 1 wherein said trenches have a depth in a range of between about 2500 and 7000 Å, and a width in a range of between about 0.2 µm and 200 µm.

4. The method of claim 1 wherein said liner layer has a thickness in a range of between about 100 and 400 Å.

5. The method of claim 1 wherein the large angle Boron implantation performed at an energy between about 15 and 45 Kev, a dose between about 3E12 and 5E13 ions/cm$^2$ and at an angle to the substrate surface between about 15 and 45 degrees.

6. The method of claim 1 wherein said Boron doped regions have a width in a range of between about 200 and 1000 Å and a boron concentration in a range of between about 1E18 and 1E20 atoms/cm$^3$.

7. A method of fabrication shallow trench isolation in a NMOS area using a large angle Boron ion implant to reduce the NMOS reverse narrow width effect; comprising the steps of:

a) providing a substrate have a NMOS area and a PMOS area; said NMOS area is where NMOS devices will be built and said PMOS area is where PMOS devices will be built;

b) depositing a pad oxide layer and a barrier layer;

c) etching trenches in said substrate in said NMOS and PMOS areas; said trenches define active region areas and isolation areas; said trenches having sidewalls and a bottom; the etching forms narrow active areas and wide active areas ; Said narrow active areas have a width between 0.4 and 1.0 µm; said wide active areas have a width greater than 1.0 µm;

d) growing a liner layer composed of thermal oxide on said substrate in said trenches;

e) forming a first photoresist layer covering said PMOS areas and having a first opening over said NMOS areas;

f) performing a large angle Boron implantation into said sidewalls and said bottom of said trenches forming Boron doped regions in said substrate;
  (1) the large angle Boron implantation is performed at an energy between about 15 and 45 Kev, a dose between about 3E12 and 5E13 ions/cm$^2$ and at an angle to the substrate surface between about 15 and 45 degrees;

g) removing said first photoresist layer;

h) depositing an insulating layer in said trenches in said NMOS and PMOS areas and forming PMOS field effect transistors in said PMOS areas and forming NMOS field effect transistors in said NMOS areas whereby said boron doped regions reduce the reverse narrow wide effect in the NMOS areas.

8. The method of claim 7 wherein said trenches have a depth in a range of between about 2500 and 7000 Å and a width in a range of between about 0.2 µm and 200 µm.

9. The method of claim 7 wherein said Boron doped regions have a width in a range of between about 200 and 1000 Å and a boron concentration in a range of between about 1E18 and 1E20 atoms/cm$^3$.

10. A method of fabrication shallow trench isolation (STI) in a NMOS area but using a large angle Boron ion implant to reduce the NMOS reverse narrow width effect; comprising the steps of:

a) providing a substrate have a NMOS area and a PMOS area; said NMOS area is where NMOS devices will be built and said PMOS area is where PMOS devices will be built;

b) depositing a pad oxide layer and a barrier layer composed of silicon nitride;

c) etching trenches in said substrate in said NMOS and PMOS areas; said trenches define active region areas and isolation areas; said trenches having sidewalls and a bottom; the etching forms narrow active areas and wide active areas ; Said narrow active areas have a width between 0.4 and 1.0 µm; said wide active areas have a width greater than 1.0 µm;
  (1) said trenches have a depth in a range of between about 2500 and 7000 Å and a width in a range of between about 0.2 µm and 200 um;

d) growing a liner layer composed of thermal oxide on said substrate in said trenches; said liner layer has a thickness in a range of between about 100 and 400 Å;

e) forming a first photoresist layer covering said PMOS areas and having first opening over said NMOS areas;

f) performing a large angle Boron implantation into said sidewalls and said bottom of said trenches forming Boron doped regions in said substrate; the large angle Boron implantation performed at an energy between about 15 and 45 Kev, a dose between about 3E12 and 5E13 ions/cm$^2$ and at an angle to the substrate surface between about 15 and 45 degrees at an energy between about 15 and 45 Kev;
  (1) said Boron doped regions having a width in a range of between about 200 and 1000 Å and a boron concentration in a range of between about 1E18 and 1E 20 atoms/cm$^3$;

g) removing said first photoresist layer;

h) depositing an insulating layer in said trenches in said NMOS and PMOS areas and forming PMOS field effect transistors in said PMOS areas and forming NMOS field effect transistors in said NMOS areas whereby said boron doped regions reduce the reverse narrow wide effect in the NMOS areas.

* * * * *